(12) United States Patent
Li et al.

(10) Patent No.: US 11,855,212 B2
(45) Date of Patent: Dec. 26, 2023

(54) FDSOI DEVICE STRUCTURE AND PREPARATION METHOD THEREOF

(71) Applicant: Shanghai Huali Integrated Circuit Corporation, Shanghai (CN)

(72) Inventors: Zhonghua Li, Shanghai (CN); Runling Li, Shanghai (CN); Nan Li, Shanghai (CN); Jianghua Leng, Shanghai (CN); Tianpeng Guan, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 18/086,326

(22) Filed: Dec. 21, 2022

(65) Prior Publication Data

US 2023/0126031 A1    Apr. 27, 2023

Related U.S. Application Data

(62) Division of application No. 17/107,375, filed on Nov. 30, 2020, now Pat. No. 11,569,385.

(30) Foreign Application Priority Data

Sep. 21, 2020  (CN) .......................... 202010992679.2

(51) Int. Cl.
*H01L 29/78* (2006.01)
*H01L 29/26* (2006.01)
(Continued)

(52) U.S. Cl.
CPC .... *H01L 29/7848* (2013.01); *H01L 21/76243* (2013.01); *H01L 29/0638* (2013.01); *H01L 29/263* (2013.01)

(58) Field of Classification Search
CPC ..... H01L 21/823412; H01L 21/823807; H01L 29/66522; H01L 29/20–2006; H01L 29/16–1608; H01L 29/22–2206; H01L 29/18–185; H01L 29/66045; H01L 29/1602
See application file for complete search history.

(56) References Cited

U.S. PATENT DOCUMENTS

| | | | | |
|---|---|---|---|---|
| 2010/0151693 A1* | 6/2010 | Shimizu | ............... | H01L 29/1054 |
| | | | | 257/E21.24 |
| 2013/0193514 A1* | 8/2013 | Loubet | .............. | H01L 29/66477 |
| | | | | 438/479 |
| 2020/0105895 A1* | 4/2020 | Tang | ................. | H01L 29/66795 |

* cited by examiner

Primary Examiner — Julio J Maldonado
Assistant Examiner — Stanetta D Isaac
(74) Attorney, Agent, or Firm — Alston & Bird LLP (57) ABSTRACT

FDSOI device fabrication method is disclosed. The method comprises: disposing a buried oxide layer on the silicon substrate; disposing a SiGe channel on the buried oxide layer, disposing a nitrogen passivation layer on the SiGe channel layer; disposing a metal gate on the nitrogen passivation layer, and attaching sidewalls to sides of the metal gate; and disposing source and drain regions on the nitrogen passivation layer at both sides of the metal gate, wherein the source and drain regions are built in a raised SiGe layer. The stack structure of the SiGe layer and the nitrogen passivation layer forms the gate channel. This stack structure avoids the low stress of the silicon channel in the conventional device. In addition, it prevents the Ge diffusion from the SiGe channel to the gate dielectric in the conventional device. Thereby the invention improves reliability and performance of the device.

9 Claims, 4 Drawing Sheets

(51) Int. Cl.
*H01L 29/06* (2006.01)
*H01L 21/762* (2006.01)

FDSOI DEVICE STRUCTURE AND PREPARATION METHOD THEREOF

CROSS-REFERENCES TO RELATED APPLICATIONS

This application is the divisional application of U.S. patent application Ser. No. 17/107,375 and claims the priority to U.S. Patent Application Ser. No. 17/107,375, filed Nov. 30, 2020, which claims the priority of Chinese patent application No. CN 202010992679.2, filed on Sep. 21, 2020 at CNIPA, and both entitled "FDSOI DEVICE STRUCTURE AND PREPARATION METHOD THEREOF", the disclosure of which is incorporated herein by reference in entirety.

TECHNICAL FIELD

The present application relates to the field of semiconductor technologies, in particular to an FDSOI device structure and a fabrication method thereof.

BACKGROUND

At present, a silicon channel-metal gate process is widely used in fabricating a 22 nm node Fully Depleted Silicon-on-Insulator (FDSOI) PMOS, where is the devices have silicon channels and high-k metal gates. Being silicon channels, the stress in the channels needs to be further increased. Therefore, in order to in the channels, the silicon channels have been replaced with SiGe channels to increase the stress. Further metal gates have also been deployed. The combined SiGe channel and metal gate process has significantly increased the compressive stress in the channels, thereby hole mobility has been improved significantly.

However, germanium (Ge) atoms in the SiGe channel of the existing technology may diffuse into the gate dielectric, thereby reducing reliability and performance of the devices.

Therefore, it is necessary to provide a new device structure and fabrication method to solve the above problem.

BRIEF SUMMARY

In view of the above-described defects in the current devices, the present application provides an FDSOI device structure and a preparation method thereof.

The present application provides an FDSOI device structure, comprising at least:

a silicon substrate; a buried oxide layer disposed on the silicon substrate; a SiGe channel located on the buried oxide layer, wherein the thickness of the SiGe channel is in a range of 60-100 Å; a nitrogen passivation layer disposed on the SiGe channel layer; a metal gate disposed on the nitrogen passivation layer and a sidewall attached to sides of the metal gate; and a source-drain region disposed on the nitrogen passivation layer at both sides of the metal gate, wherein the source-drain region is a raised SiGe layer.

In some examples, the thickness of the buried oxide layer is in a range of 100-300 Å.

In some examples, the thickness of the nitrogen passivation layer is in a range of 2-20 Å.

In some examples, the metal gate comprises a first stack structure and a second stack structure disposed on the first stack structure; the first stack structure consists of a gate oxide layer structure, a high-k dielectric layer structure, and a TiN layer structure that are sequentially arranged from low to upper end; and the second stack structure comprises a TaN layer, a TiN layer, a TiAl layer, and an aluminum layer that are sequentially stacked from low to upper end.

In some examples, the thickness of the gate oxide layer structure is in a range of 6-15 Å.

In some examples, the thickness of the high-k dielectric layer structure is in a range of 15-30 Å.

In some examples, the thickness of the TiN layer structure is in a range of 15-30 Å.

In some examples, the sidewalks are a SiCN structure or SiOCN structure.

The present application further provides a method for preparing FDSOI, the method comprising at least the following steps:

step 1: providing a silicon substrate, wherein a buried oxide layer is disposed on the silicon substrate, and an SOI layer is disposed on the buried oxide layer;

step 2: forming a SiGe layer on the SOI layer by means of epitaxial deposition;

step 3: oxidizing the SiGe layer by means of high-temperature oxidation, so that Ge in the SiGe layer 04 diffuses into the SOI layer to form a SiGe channel with a thickness in a range of 60-100 Å, wherein the SiGe layer is formed into a $SiO_2$ layer;

step 4: removing the $SiO_2$ layer;

step 5: passivating an upper surface of the SiGe channel to form a nitrogen passivation layer;

step 6: sequentially depositing a gate oxide layer, a high-k dielectric layer, and a TiN layer on the nitrogen passivation layer;

step 7: forming an amorphous silicon layer on the TiN layer, depositing a hard mask layer on the amorphous silicon layer, then defining a gate morphology by means of photolithography, sequentially etching the hard mask layer, the amorphous silicon layer, the TiN layer, the high-k dielectric layer, and the gate oxide layer, to form a first stack structure consisting of a gate oxide layer structure, a high-k dielectric layer structure, and a TiN layer structure that are sequentially stacked from bottom to top and form an amorphous silicon layer structure disposed on the first stack structure and a hard mask layer structure disposed on the amorphous silicon layer structure, and then forming sidewalls of inner spacer and outer hard mask on sides of the first stack layer and the amorphous silicon layer structure;

step 8: epitaxially growing a source-drain region on the nitrogen passivation layer at both sides of the amorphous silicon layer structure, wherein the source-drain region is a raised SiGe;

step 9: removing the hard mask layer structure and the amorphous silicon layer structure, and forming a groove in the sidewall of spacer on the first stack layer;

step 10: sequentially depositing a TaN layer, a TiN layer, a TiAl layer, and an aluminum layer in the groove such that the groove is filled, to form a second stack structure, wherein the first and second stack structures and the sidewall form a metal gate; and step 11: planarizing the aluminum layer, and then performing metal interconnection.

In some examples, in step 1, an native oxide is formed on the surface of the SOI layer; and forming the SiGe layer by means of epitaxial deposition in step 2 comprises steps of: first removing the native oxide on the surface of the SOI layer using at least one of HF, SiCoNi, HCL, and $H_2$, and then growing the SiGe layer with a Ge concentration of 20%-60% in situ on the SOI layer, wherein the thickness of the SiGe layer is in a range of 50-400 Å.

In some examples, a reaction temperature of the high-temperature oxidation in step 3 is 1000-2000° C., and an oxidation mode of the high-temperature oxidation is alternately performing oxidation and annealing, wherein an annealing process is carried out in a nitrogen condition.

In some examples, a method for removing the $SiO_2$ layer in step 4 comprises removing the $SiO_2$ layer by means of washing with HF or removing the $SiO_2$ layer by means of dry etching.

In some examples, in step 4, after the $SiO_2$ layer 05 is removed, the upper surface of the SiGe channel is exposed, and the upper surface of the SiGe channel is oxidized to form an oxide; and in step 5, before the upper surface of the SiGe channel is passivated to form the nitrogen passivation layer, the oxide on the upper surface of the SiGe channel is first removed.

In some examples, in step 5, before the upper surface of the SiGe channel is passivated to form the nitrogen passivation layer, the oxide on the upper surface of the SiGe channel is removed using at least one of HF, SiCoNi, HCl, and $H_2$.

In some examples, a method for passivating the upper surface of the SiGe channel to form the nitrogen passivation layer in step 5 comprises steps of: passivating the upper surface of the SiGe channel using nitrogen or $NH_3$ plasma, and then performing annealing, so as to form the nitrogen passivation layer.

In some examples, the mode of depositing the gate oxide layer on the nitrogen passivation layer in step 6 is in-situ steam generation, and the thickness of the deposited gate oxide layer is 6-15 Å; the deposited high-k dielectric layer is $HfO_2$ or $HfLaO_2$, and the thickness of the high-k dielectric layer is 15-30 Å; and the thickness of the deposited TiN layer is 15-30 Å.

In some examples, the concentration of Ge in the raised SiGe epitaxially grown in step 8 is 20%-50%, and the raised SiGe contains boron at a concentration in a range of $1*10^{19}$-$1*10^{21}$ $cm^{-3}$; and the thickness of the raised SiGe is in a range of 200-400 Å.

As stated above, the FDSOI device structure and preparation method thereof of the present application have the following beneficial effects: in a manufacturing process of an FDSOI device of the present application, a stack structure of a SiGe layer and a nitrogen passivation layer is used as a channel, avoiding the low stress of a silicon channel in the conventional process and the diffusion of Ge in a SiGe channel to a gate dielectric in the conventional process, and thereby improving the reliability and performance of the device.

DETAILED DESCRIPTION OF THE DISCLOSURE

The implementations of the present application are described below using specific examples. Those skilled in the art could easily understand other advantages and effects of the present application from the content disclosed in the specification. The present application can also be implemented or applied in other different specific implementations, and various details in the specification can also be modified or changed based on different viewpoints and applications without departing from the spirit of the present application.

Please refer to FIGS. 1-10. It should be noted that the figures provided in the embodiments only illustrate the basic concept of the present application in a schematic manner, so the figures only show the components related to the present application, but are not drawn according to the number, shape and size of the components in actual implementations. The pattern, number, and ratio of each component in actual implementations can be changed randomly, and the component layout pattern may be more complicated.

The present application provides an FDSOI device structure, which includes at least: a silicon substrate; a buried oxide layer disclosed on the surface of the silicon substrate; a SiGe channel disclosed on the buried oxide layer, wherein the thickness of the SiGe channel is in the range of 60-100 Å; a nitrogen passivation layer disclosed on the SiGe channel layer; a metal gate disclosed on the nitrogen passivation layer, and sidewalls attached to both sides of the metal gate; and a source region and a drain region disposed on the nitrogen passivation layer at both sides of the metal gate, wherein the source region and drain region are in a raised SiGe layer.

Figure 10:
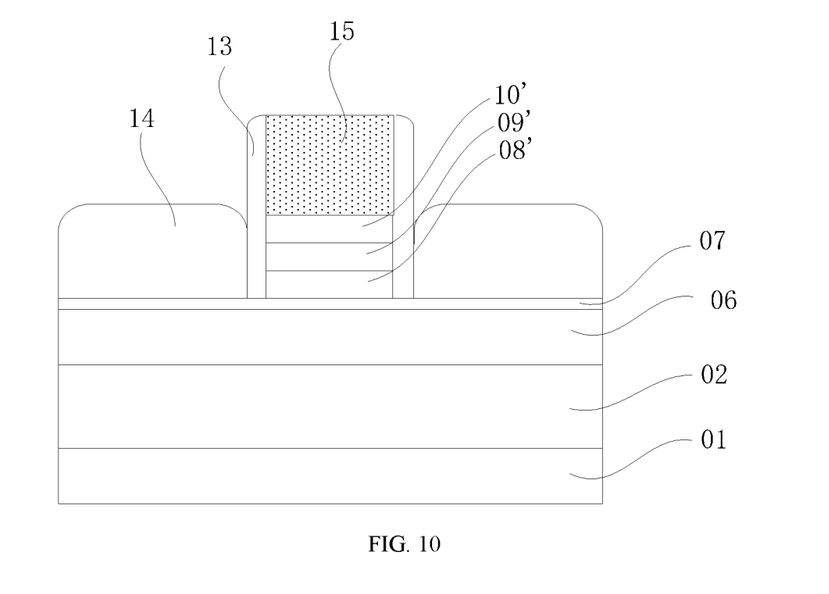
FIG. 10 is a schematic diagram of an FDSOI device structure according to an embodiment of the present application.

Referring to FIG. 10, which is a schematic diagram of an FDSOI device structure according to an embodiment of the present application. The FDSOI device structure in this embodiment includes: a silicon substrate 01; a buried oxide layer 02 disposed on the silicon substrate 01, wherein in an example, the thickness of the buried oxide layer is in the range of 100-300 Å; a SiGe channel 06 disposed on the buried oxide layer 02, wherein the thickness of the SiGe channel is in the range of 60-100 Å; a nitrogen passivation layer 07 disposed on the SiGe channel layer 06; a metal gate disposed on the nitrogen passivation layer 07 and sidewalls 13 attached to the walls of both sides of the metal gate, the metal gate includes a first stack structure of layers, and a second stack structure 15 disposed on the first stack structure. The first stack structure which includes a gate oxide layer structure 08', a high-k dielectric layer structure 09', and a TiN layer structure 10' that are sequentially stacked from low to upper end. The second stack structure includes a TaN layer, a TiN layer, a TiAl layer, and an aluminum layer that are sequentially stacked from low to upper end. As another example, the thickness of the gate oxide layer structure is in the range of 6-15 Å and the thickness of the high-k dielectric layer structure is in the range of 15-30 Å. In still another example, the thickness of the TiN layer structure is in the range of 15-30 Å; and a source region and a drain region 14 disposed on the nitrogen passivation layer 07 at both sides of the metal gate, wherein the source and drain regions are built a raised SiGe layer. In this embodiment, the sidewalls of the first and second stacks include either a SiCN structure or a SiOCN structure.

The present application further provides a method for fabricating the FDSOI device, and the method includes at least the following steps:

step 1: providing a silicon substrate, disposing a buried oxide layer on the silicon substrate, and disposing an SOI layer on the buried oxide layer;

step 2: forming a SiGe layer on the SOI layer by means of epitaxial deposition, and the SOI is typically composed of a silicon layer on an $SiO_2$ layer;

step 3: oxidizing the SiGe layer by means of high-temperature diffusion, so that Ge elements in the SiGe layer are driven into the SOI layer to form a SiGe channel with a thickness in the range of 60-100 Å, and the SiGe layer replaces the silicon layer remaining on the $SiO_2$ layer;

step 4: removing the $SiO_2$ layer;

step 5: passivating an upper surface of the SiGe channel to form a nitrogen passivation layer;

step 6: sequentially depositing a gate oxide layer, a high-k dielectric layer, and a TiN layer on the nitrogen passivation layer;

step 7: forming an amorphous silicon layer on the TiN layer, depositing a hard mask layer on the amorphous silicon layer, then defining a gate morphology by means of photolithography, sequentially etching the hard mask layer, the amorphous silicon layer, the TiN layer, the high-k dielectric layer, and the gate oxide layer, to form a first stack structure which includes a gate oxide layer structure, a high-k dielectric layer structure, and a TiN layer structure that are sequentially stacked from low to upper end, and further forming an amorphous silicon layer structure disposed on the first stack structure and a hard mask layer structure disposed on the amorphous silicon layer structure. In addition, step 7 includes, forming sidewalls which become inner spacers and outer hard masks on the sides of the first stack layer and the amorphous silicon layer structure;

step 8: epitaxially growing a source region and a drain region on the nitrogen passivation layer at both sides of the amorphous silicon layer structure, wherein the source and drain regions are built in a raised SiGe layer;

step 9: removing the hard mask layer structure and the amorphous silicon layer structure, and forming a groove in the sidewall of spacer on the first stack layer;

step 10: sequentially depositing a TaN layer, a TiN layer, a TiAl layer, and an aluminum layer to fill in the groove, these four layers form a second stack structure 15, wherein the first stack structure 08', 09', 10', the second stack structure 15 and the sidewalls 13 form the metal gate; and step 11: planarizing the aluminum layer, followed by interconnecting metal layers.

Referring to FIGS. 1-9, the method for fabricating a FDSOI device in this embodiment includes the following steps in more details.

Figure 1:
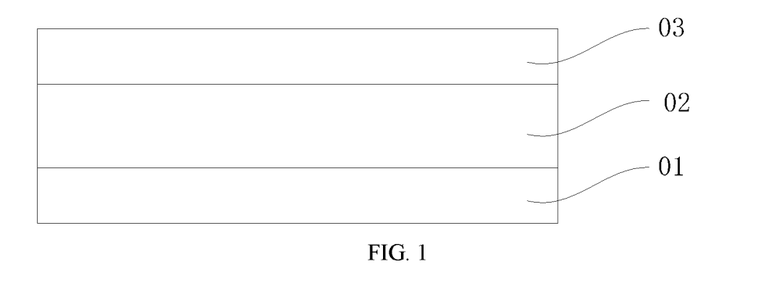
FIG. 1 is a schematic diagram of a FDSOI device substrate, including a silicon substrate, a buried oxide layer, and an SOI layer disposed on the silicon substrate according to the present application.
Figure 2:
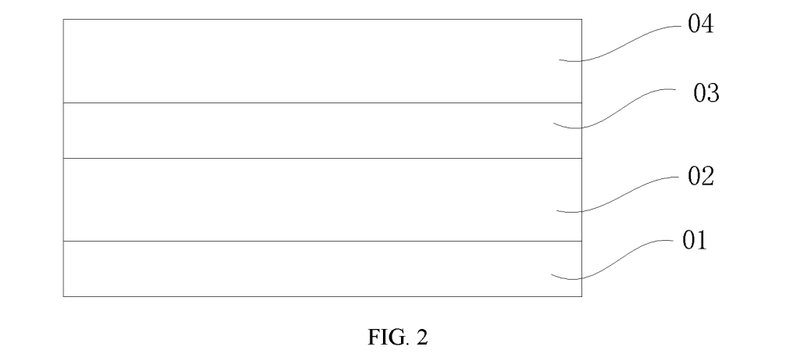
FIG. 2 is a schematic diagram of the structure after a SiGe layer is disposed on the SOI layer, according to the present application.

Step 1: A silicon substrate 01 is provided, wherein a buried oxide layer 02 is disposed on the silicon substrate 01, and a silicon-on-insulator (SOI) layer 03 is disposed on the buried oxide layer 02. Referring to FIG. 1, a schematic diagram of the structure of the silicon substrate, the buried oxide layer, and SOI layer on the silicon substrate according to the present application.

Step 2: A SiGe layer 04 is formed on the SOI layer 03 by means of epitaxial deposition, referring to FIG. 2, which is a schematic diagram of the structure after the SiGe layer is disposed on the SOI layer according to the present application. An native oxide layer is formed on the surface of the SOI layer in step 1, because an upper surface of the SOI layer is exposed to the air, therefore growing an native oxide layer. Therefore, in step 2 forming the SiGe layer 04 includes steps of: first removing the native oxide on the surface of the SOI layer using at least one of hydrogen fluoride (HF), SiCoNi™, HCL, and $H_2$, and then growing the SiGe layer 04 in situ with a Ge concentration in a range of 20%-60% on the SOI layer, wherein the thickness of the SiGe layer 04 is in a range of 50-400 Å.

Step 3: The SiGe layer 04 is oxidized by means of high-temperature diffusion, in which Ge atoms in the SiGe layer 04 are driven into the SOI layer to form a SiGe channel 06 with a thickness in the range of 60-100 Å, in this process the Ge layer has turned into a SiGe layer 04 over a $SiO_2$ layer 05, referring to FIG. 3, a schematic diagram of a structure after forming the SiGe channel and the $SiO_2$ layer thereon according to the present application.

Figure 3:
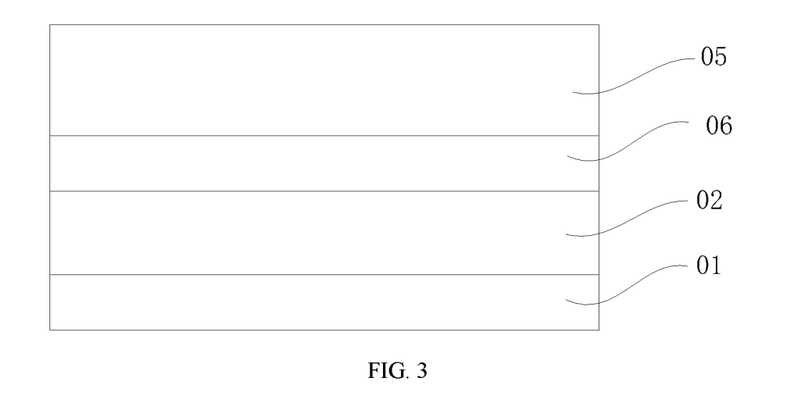
FIG. 3 is a schematic diagram of the structure after disposing a SiGe channel and a $SiO_2$ layer, according to the present application.
Figure 4:
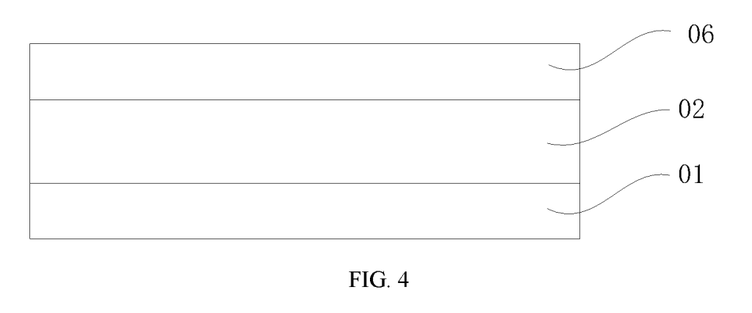
FIG. 4 is a schematic diagram of the structure after removing the $SiO_2$ layer from the SiGe channel according to the present application.

In an example of the present application, a reaction temperature of the high-temperature oxidation in step 3 is in a range of 1000-2000° C., and the mode of the high-temperature oxidation is alternately performing oxidation and annealing, wherein the annealing process is carried out in a nitrogen environment. That is to say, step 3 is performed in a high-temperature environment in a range of 1000-2000° C. to oxidize the SiGe layer 04. In addition, the Ge element in the SiGe layer 04 undergoes the alternating high temperature oxidation-annealing cycles for a number of times, as the result, Ge diffuses into the silicon-on-insulator (SOI) layer 03 beneath the SiGe layer 04, thereby forming the SiGe channel 06. After the Ge element in the SiGe layer fully diffuses into the SOI layer, only oxidized silicon remains in this layer, as shown in FIG. 3, thereby forming the $SiO_2$ layer 05 located on the SiGe channel 06.

Step 4: The $SiO_2$ layer 05 is removed, shown as in FIG. 4, which is a schematic diagram of the structure after removing the $SiO_2$ layer from the SiGe channel according to the present application. In an example, a method for removing the $SiO_2$ layer in step 4 includes removing the $SiO_2$ layer 05 by wet etching in HF or removing the $SiO_2$ layer by dry etching.

Figure 5:
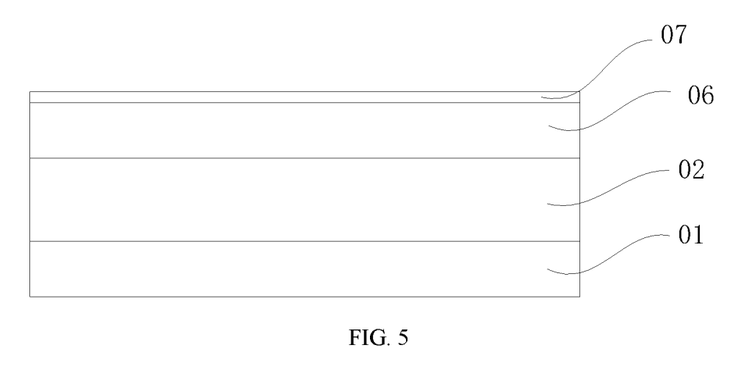
FIG. 5 is a schematic structural diagram of forming a nitrogen passivation layer on the SiGe channel according to the present application.
Figure 6:
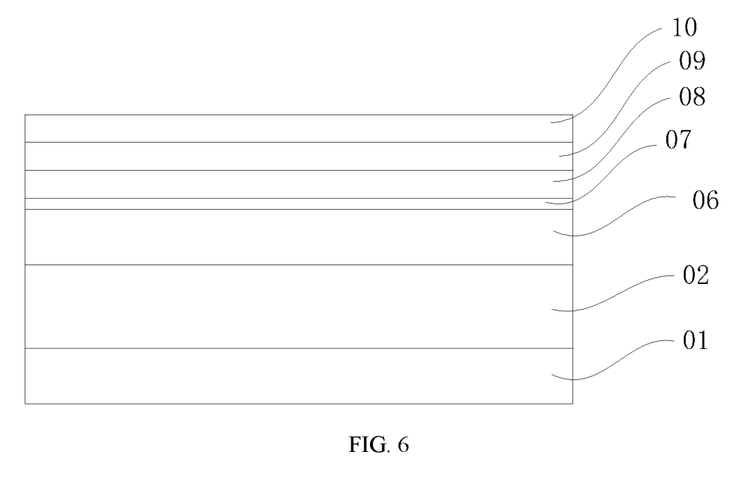
FIG. 6 is a schematic diagram of the structure after disposing a gate oxide layer, a high-k dielectric layer, and a TiN layer on the nitrogen passivation layer according to the present application.

Step 5: Referring to FIG. 5, passivating the upper surface of the SiGe channel with a nitrogen passivation layer, FIG. 5 shows the structure after the nitrogen passivation layer has disposed on the SiGe channel. In an example, in step 5, the oxide on the upper surface of the SiGe channel 06 is first removed using at least one of HF, SiCoNi™, HCL, and $H_2$, then the upper surface of the SiGe channel 06 is passivated to form the nitrogen passivation layer 07. In an example of the present application, in step 4, after the $SiO_2$ layer 05 is removed, the upper surface of the SiGe channel 06 is exposed, and the upper surface of the SiGe channel 06 is oxidized to form an oxide; and in step 5, the oxide on the upper surface of the SiGe channel 06 is first removed, then the upper surface of the SiGe channel is passivated to form the nitrogen passivation layer.

In another example, a method for passivating the upper surface of the SiGe channel to form the nitrogen passivation layer in step 5 includes steps of: passivating the upper surface of the SiGe channel using nitrogen or $NH_3$ plasma, and then performing annealing, so as to form the nitrogen passivation layer. So in this embodiment, after the oxide on the upper surface of the SiGe channel 06 is removed, then the upper surface of the SiGe channel is passivated using nitrogen or $NH_3$ plasma, to form the nitrogen passivation layer 07.

Step 6: A gate oxide layer, a high-k dielectric layer, and a TiN layer are sequentially deposited on the nitrogen passivation layer, referring to FIG. 6, which is a schematic diagram of the structure after the gate oxide layer, the high-k dielectric layer, and the TiN layer are disposed on the nitrogen passivation layer according to the present application. In step 6, the gate oxide layer 08, the high-k dielectric layer 09, and the TiN layer 10 are sequentially deposited on the nitrogen passivation layer 07. In an example of the present application, the technique of depositing the gate oxide layer 08 on the nitrogen passivation layer 07 in step 6 is in-situ steam growth, and the thickness of the deposited gate oxide layer 08 is in a range of 6-15 Å; the deposited high-k dielectric layer 09 is $HfO_2$ or $HfLaO_2$, and the thickness of the high-k dielectric layer 09 is in a range of 15-30 Å; and the thickness of the deposited TiN layer 10 is in a range of 15-30 Å.

Figure 7:
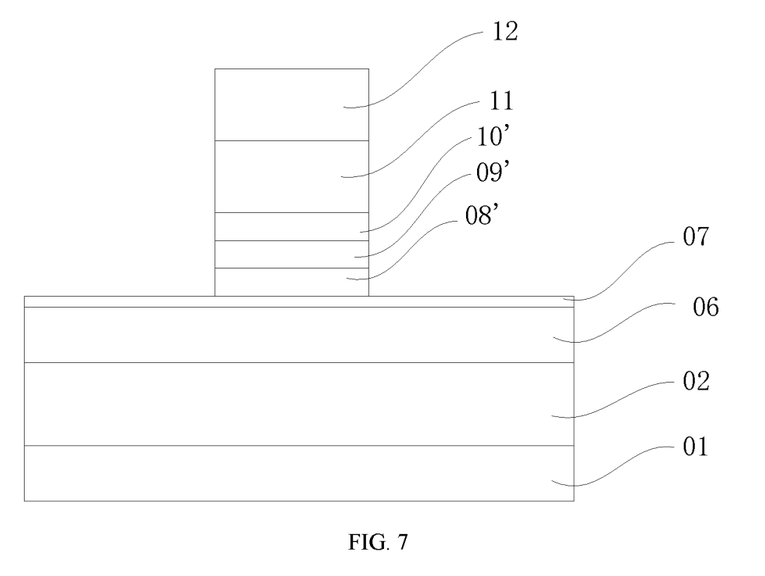
FIG. 7 is a schematic structural diagram of forming a first stack structure, an amorphous silicon layer structure, and a hard mask layer structure one the nitrogen passivation layer according to the present application.
Figure 8:
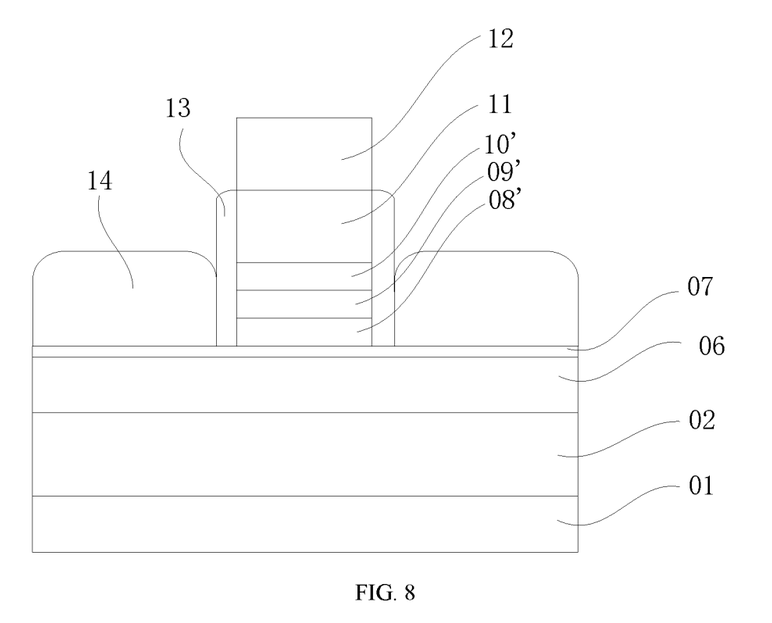
FIG. 8 is a schematic diagram of a structure after forming a source and a drain regions, sidewalls of inner spacer and an outer hard mask on sides of the amorphous silicon layer structure according to the present application.
Figure 9:
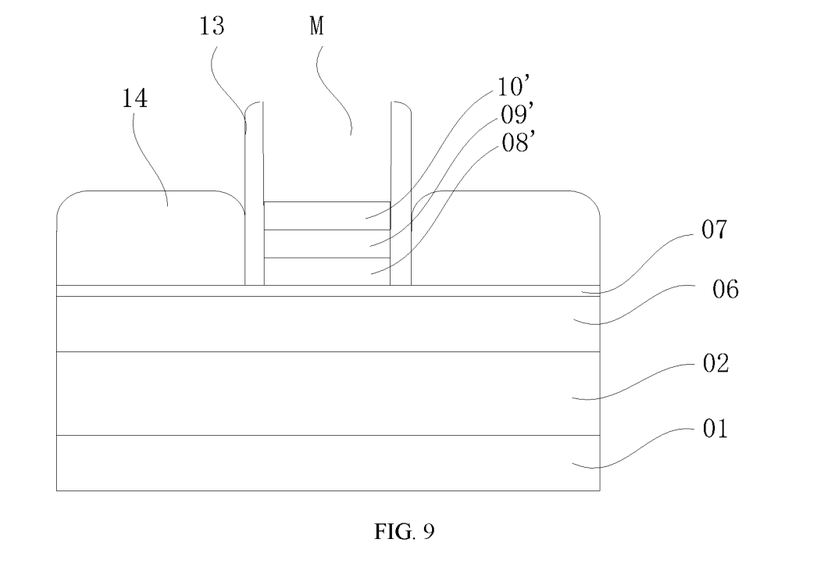
FIG. 9 is a schematic diagram of the structure after removing the amorphous silicon layer structure to form a groove according to the present application.

For step 7, reference is made to FIG. 7, a schematic diagram of the structure after forming a first stack structure, an amorphous silicon layer structure, and a hard mask layer structure on the nitrogen passivation layer according to the present application. Step 7: An amorphous silicon layer is formed on the TiN layer, a hard mask layer is deposited on the amorphous silicon layer, a gate morphology is defined by a photolithography process, followed by sequential etching the hard mask layer, the amorphous silicon layer, the TiN layer, the high-k dielectric layer, and the gate oxide layer, to form a first stack structure. The first stack structure includes a gate oxide layer structure 08', a high-k dielectric layer structure 09', and a TiN layer structure 10' that are sequentially stacked from low to upper end. An amorphous silicon layer structure 11 is disposed on the first stack structure, a hard mask layer structure 12 is disposed on the amorphous silicon layer structure 11, and then sidewalls are formed on the walls of the sides of the first stack layer and the amorphous silicon layer structure 11. Referring to FIG. 8, which is a schematic diagram of the structure after forming a source and a drain regions and sidewalls on the sides of the amorphous silicon layer structure according to the present application. The sidewalls 13 are attached to the sides of the first stack layer and the amorphous silicon layer structure 11.

Step 8: A source and a drain regions are epitaxially grown on the nitrogen passivation layer at both sides of the first stack layer and the amorphous silicon layer structure, wherein the source and drain regions are built in a raised SiGe layer, referring to FIG. 8, the source and drain regions 14 are built in a raised SiGe layer, the first stack layer and the amorphous silicon layer structure will be part of the metal gate, and the source and drain regions will be formed on both sides of the metal gate.

Step 9: The hard mask layer structure and the amorphous silicon layer structure are removed, and a groove is formed on the first stack layer and in between the sidewalls, referring to FIG. 9, which is a schematic diagram of the structure after removing the amorphous silicon layer structure to form the groove according to the present application. In step 9, the amorphous silicon layer structure on the first stack layer is removed, and the groove M is formed. In an example, the Ge concentration in the epitaxially grown raised SiGe layer in step 8 of this embodiment is in the range of 20%-50%, and the raised SiGe layer contains boron at a concentration in the range of $1*10^{19}$-$1*10^{21}$ $cm^{-3}$; and the thickness of the raised SiGe is in a range of 200-400 Å.

Step 10: A TaN layer, a TiN layer, a TiAl layer, and an aluminum layer are sequentially deposited to fill the groove, and to form a second stack structure, wherein the first and second stack structures and the sidewalls form a metal gate, referring to FIG. 10, which is schematic diagram of the structure after the second stack structure filled the groove. The second stack structure includes a TaN layer disposed on the first stack layer, a TiN layer disposed on the TaN layer, a TiAl layer disposed on the TiN layer, and an aluminum layer disposed on the TiAl layer. The metal gate in the present application includes the first stack layer, the second stack structure, and the sidewalls.

Step 11: The aluminum layer is planarized, followed by forming metal interconnection.

In conclusion, the present application discloses that a FDSOI device what has a channel of a stack structure of a SiGe layer and a nitrogen passivation layer. This channel avoids the low stress of a silicon channel in the conventional process. In addition, this structure prevents the diffusion of Ge in the SiGe channel into the gate dielectric in the conventional process. Therefore, reliability and performance of the device are improved. The present invention can effectively overcome these issues in the current technology, thus deserves a high value in industrial utilization.

The above embodiments only exemplarily illustrate the principle and effect of the present application, but are not intended to limit the present application. Those skilled in the art could modify or change the above embodiments without departing from the spirit and scope of the present application. Therefore, all equivalent modifications or changes made by those with ordinary knowledge in the technical field without departing from the spirit and technical concept disclosed in the present application shall still be covered by the claims of the present application.

What is claimed is:

1. A method for fabricating a FDSOI device, comprising at least following steps:
    step 1: providing a silicon substrate, disposing a buried oxide layer on the silicon substrate, and disposing a silicon-on-insulator (SOI) layer on the buried oxide layer;
    step 2: forming a silicon-germanium (SiGe) layer on the SOI layer by means of epitaxial deposition;
    step 3: oxidizing the SiGe layer by means of high-temperature oxidation, wherein germanium atoms in the SiGe layer diffuse into the SOI layer to form a SiGe channel layer, wherein a thickness of the SiGe channel layer is in a range of 60-100 A, wherein a $SiO_2$ layer is formed on the SiGe channel layer;
    step 4: removing the SiO2 layer;
    step 5: passivating an upper surface of the SiGe channel layer to form a nitrogen passivation layer;
    step 6: sequentially depositing a gate oxide layer, a high-k dielectric layer, and a first TiN layer on the nitrogen passivation layer;
    step 7: forming an amorphous silicon layer on the first TiN layer, depositing a hard mask layer on the amorphous silicon layer, then defining a gate morphology by means of a photolithography process, followed by etching sequentially the hard mask layer, the amorphous silicon layer, the first TiN layer, the high-k dielectric layer, and the gate oxide layer, to form a first stack structure;

wherein the first stack structure comprises a gate oxide layer structure, a high-k dielectric layer structure, and a first TiN layer structure that are sequentially stacked from bottom to top;

wherein step 7 further comprises: forming an amorphous silicon layer structure located on the first stack structure and forming a hard mask layer structure located on the amorphous silicon layer structure, then forming sidewalls of inner spacers, and forming an outer hard mask on sides of the first stack layer and the amorphous silicon layer structure;

step 8: growing epitaxially a raised SiGe layer at both sides of the amorphous silicon layer structure, and forming a source region and a drain region in the raised SiGe layer;

step 9: removing the hard mask layer structure and the amorphous silicon layer structure, and forming a groove between the sidewalls of the inner spacers of the first stack layer;

step 10: sequentially depositing a TaN layer, a second TiN layer, a TiAl layer, and an aluminum layer in the groove, so to form a second stack structure in the groove, wherein the first stack structure, the second stack structure and the sidewalls of the inner spacers of the first stack layer form a metal gate, wherein the sidewalls cover sides of the first stack structure and extend up to a portion of the second stack structure; and step 11: planarizing the aluminum layer, and then forming metal interconnection.

2. The method for fabricating the FDSOI device according to claim 1, wherein step 1 further comprises, forming an native oxide on a surface of the SOI layer; and in step 2, forming the SiGe layer by epitaxial deposition comprises steps of: first removing the native oxide from the surface of the SOI layer using at least one of HF, SiCoNi, HCL, and $H_2$, and then growing the SiGe layer with a Ge concentration in a range of 0%-60% in-situ on the SOI layer, wherein a thickness of the SiGe layer is in a range of 50-400 Å.

3. The method for fabricating the FDSOI device according to claim 1, wherein a reaction temperature of the high-temperature oxidation in step 3 is in a range of 1000-2000° C., and an oxidation mode of the high-temperature oxidation is alternately applying an oxidation and an annealing process, wherein the annealing process is carried out in a nitrogen environment.

4. The method for fabricating the FDSOI device according to claim 1, wherein removing the $SiO_2$ layer in step 4 comprises removing the $SiO_2$ layer by wet etching with HF or removing the $SiO_2$ layer by dry etching.

5. The method for fabricating the FDSOI device according to claim 1, wherein in step 4, after the $SiO_2$ layer is removed, an upper surface of the SiGe channel layer is exposed and oxidized to form an oxide; and wherein in step 5, the oxide on the upper surface of the SiGe channel layer is first removed, and then followed by nitrogen passivation to form the nitrogen passivation layer.

6. The method for fabricating the FDSOI device according to claim 5, wherein in step 5, wherein the oxide on the upper surface of the SiGe channel layer is removed using at least one of HF, $SiC_oNi$, HCl, and $H_2$.

7. The method for fabricating the FDSOI device according to claim 1, wherein in step 5, a method for passivating the upper surface of the SiGe channel layer to form the nitrogen passivation layer comprises steps of: passivating the upper surface of the SiGe channel layer using nitrogen or NH3 plasma, and then performing annealing, so as to form the nitrogen passivation layer.

8. The method for fabricating the FDSOI device according to claim 1, wherein in step 6, a technique of depositing the gate oxide layer on the nitrogen passivation layer comprises in-situ steam growth, wherein a thickness of the gate oxide layer is in a range of 6-15 Å; wherein the high-k dielectric layer is $HfO_2$ or $HfLaO_2$, a thickness of the high-k dielectric layer is in a range of 15-30 Å; and wherein a thickness of the deposited first TiN layer is in a range of 15-30 Å.

9. The method for fabricating the FDSOI device according to claim 1, wherein in step 8, a concentration of Ge in the epitaxially grown raised SiGe layer is in a range of 20%-50% and wherein the raised SiGe layer comprises boron at a concentration in a range of $1*10^{19}$-$1*10^{21}$ $cm^{-3}$; and wherein a thickness of the raised SiGe layer is in a range of 200-400 Å.

* * * * *